US007692195B2

(12) United States Patent
Namose

(10) Patent No.: US 7,692,195 B2
(45) Date of Patent: Apr. 6, 2010

(54) ACTIVE-MATRIX DEVICE, ELECTRO-OPTICAL DISPLAY DEVICE, AND ELECTRONIC APPARATUS

(75) Inventor: Isamu Namose, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/254,377

(22) Filed: Oct. 20, 2008

(65) Prior Publication Data

US 2009/0121226 A1 May 14, 2009

(30) Foreign Application Priority Data

Nov. 9, 2007 (JP) ............................ 2007-292610

(51) Int. Cl.
*H01L 31/112* (2006.01)

(52) U.S. Cl. ................................ 257/66; 257/E31.095

(58) Field of Classification Search .................. 257/66, 257/E31.095; 345/3.1
See application file for complete search history.

(56) References Cited

U.S. PATENT DOCUMENTS

| | | | | |
|---|---|---|---|---|
| 4,681,403 | A | 7/1987 | Te velde et al. | |
| 5,578,976 | A | 11/1996 | Yao | |
| 6,483,395 | B2 | 11/2002 | Kasai et al. | |
| 6,872,902 | B2 * | 3/2005 | Cohn et al. | 200/181 |
| 2005/0116924 | A1 * | 6/2005 | Sauvante et al. | 345/108 |

FOREIGN PATENT DOCUMENTS

| | | |
|---|---|---|
| JP | 58-018675 | 2/1983 |
| JP | 61-235820 | 10/1986 |
| JP | 01-156725 | 6/1989 |
| JP | 09-017300 | 1/1997 |
| JP | 11-212059 | 8/1999 |
| JP | 2001-266727 | 9/2001 |
| JP | 2003-071798 | 3/2003 |
| JP | 2004-006782 | 1/2004 |
| JP | 2005-534510 | 11/2005 |
| JP | 2006-510066 | 3/2006 |
| JP | 2007-504608 | 3/2007 |
| JP | 2007-242462 | 9/2007 |
| WO | 2004-013039 | 2/2004 |
| WO | 2004-059378 | 7/2004 |
| WO | 2005-022575 | 3/2005 |
| WO | WO2005-113421 | 12/2005 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

An active-matrix device includes a substrate; a plurality of pixel electrodes provided on a first surface of the substrate; a plurality of switching elements provided to correspond to each of the pixel electrodes, each of the switching elements including a fixed electrode connected to the each pixel electrode, a movable electrode mainly made of silicon and displaceably provided so as to contact with and separate from the fixed electrode, and a driving electrode provided to oppose the movable electrode via an electrostatic gap; a first wiring connected to the movable electrode; and a second wiring connected to the driving electrode, wherein a voltage is applied between the movable electrode and the driving electrode to generate an electrostatic attraction between the movable electrode and the driving electrode so as to displace the movable electrode such that the movable electrode contacts with the fixed electrode to electrically connect the first wiring to the pixel electrode.

18 Claims, 10 Drawing Sheets

ACTIVE-MATRIX DEVICE, ELECTRO-OPTICAL DISPLAY DEVICE, AND ELECTRONIC APPARATUS

BACKGROUND

1. Technical Field

The present invention relates to an active-matrix device, an electro-optical display device, and an electronic apparatus.

2. Related Art

For example, a liquid crystal display (LCD) panel employing an active-matrix driving system includes an active-matrix device with a plurality of pixel electrodes, switching elements corresponding to the pixel electrodes, and wirings connected to the switching elements (e.g. See JP-A-2004-6782).

In general, the active-matrix device uses a thin film transistor (TFT) as each of the switching elements. The TFT is composed of a semiconductor layer made of an amorphous silicon (a-Si) thin film or a polycrystalline silicon (p-Si) thin film. Those thin films are photoconductive, which may cause a leakage of incident light, thereby possibly reducing an off resistance of the TFT and shifting a threshold voltage of the TFT.

In order to solve the light leakage problem, it is common to provide a light-shielding layer such as a black matrix that shields light incident to the TFT. However, providing the light-shielding layer reduces an aperture ratio of the panel, thus reducing an amount of light passing through the panel.

Therefore, the active-matrix device (a backplane for an electro-optical display device) disclosed in JP-A-2004-6782 uses a mechanical switching element instead of the foregoing TFT. The mechanical switching element does not cause light leakage. Accordingly, no light-shielding layer is needed, thus increasing the aperture ratio. In addition, the mechanical switching element does not cause temperature-related characteristic fluctuations as occurring in the TFT, so that the switching element exhibits excellent switching characteristics.

In the switching element employed in the active-matrix device of the above related art, an actuator electrode is arranged so as to oppose a cantilever. Electrifying the actuator electrode generates an electrostatic attraction between the actuator electrode and the cantilever, whereby the cantilever is displaced to contact with each pixel electrode. This can establish an electrical continuity between the pixel electrode and the wiring.

In the above active-matrix device, however, the cantilever made of a metal is likely to have metal fatigue (fatigue destruction) due to a long-term use thereof, which can deteriorate switching characteristics of the switching element. Consequently, the active-matrix device of the related art is less reliable.

SUMMARY

An advantage of the present invention is to provide an active-matrix device, an electro-optical display device, and an electronic apparatus that are highly reliable and achieve an improved aperture ratio.

The advantage of the invention is obtained by aspects of the invention described below.

An active-matrix device according to a first aspect of the invention includes a substrate; a plurality of pixel electrodes provided on a first surface of the substrate; a plurality of switching elements provided to correspond to each of the pixel electrodes, each of the switching elements including a fixed electrode connected to the each pixel electrode, a movable electrode mainly made of silicon and displaceably provided so as to contact with and separate from the fixed electrode, and a driving electrode provided to oppose the movable electrode via an electrostatic gap; a first wiring connected to the movable electrode; and a second wiring connected to the driving electrode, in which a voltage is applied between the movable electrode and the driving electrode to generate an electrostatic attraction between the movable electrode and the driving electrode so as to displace the movable electrode such that the movable electrode contacts with the fixed electrode to electrically connect the first wiring to the pixel electrode.

In this manner, there can be provided an active-matrix device that is highly reliable and has an improved aperture ratio.

In the active-matrix device according to the first aspect, preferably, the movable electrode includes a silicon layer made of monocrystalline silicon.

This enables the movable electrode to have excellent mechanical characteristics.

In the active-matrix device above, preferably, the silicon layer is formed by depositing an amorphous silicon film and then annealing the film.

This enables the movable electrode to be formed with a high precision in size, as well as enables miniaturization of the switching element.

In the active-matrix device according to the first aspect, preferably, the movable electrode is made of silicon carbide.

This can improve conductivity of the first wiring, thereby improving reliability of the active-matrix device.

In the active-matrix device according to the first aspect, preferably, the movable electrode is doped with an impurity that improves conductivity of the movable electrode.

This can improve the conductivity of the movable electrode, thereby reducing a driving voltage of the switching element and also improving switching characteristics of the switching element.

In the active-matrix device according to the first aspect, preferably, on the movable electrode is formed a thin film made of a material having a conductivity higher than that of silicon.

This can improve the conductivity of the movable electrode, thereby reducing a driving voltage of the switching element and improving switching characteristics of the switching element.

In the active-matrix device according to the first aspect, preferably, the fixed electrode, the movable electrode, and the driving electrode are arranged such that the movable electrode contacts with the fixed electrode while remaining separated from the driving electrode.

This can prevent adhesion between the movable electrode and the driving electrode, thus improving the reliability of the active-matrix device.

In the active-matrix device above, preferably, the movable electrode is cantilever-supported to displace a free end side of the movable electrode; the fixed electrode is located so as to oppose an end region on the free end side of the movable electrode; and the driving electrode is located relative to the fixed electrode so as to oppose a region on a fixed end side of the movable electrode.

This can simplify a structure of the switching element. Additionally, since the driving electrode opposes the region of the movable electrode having the fixed end, there occurs a large reaction force allowing the movable electrode to return to an initial state when the movable electrode is displaced (bendingly deformed) toward the driving electrode. Accordingly, the above structure can prevent the adhesion between the driving electrode and the movable electrode.

In the active-matrix device according to the first aspect, preferably, the pixel electrodes are located in positions different from the switching elements in a thickness direction of the substrate to allow the each pixel electrode to be arranged so as to cover the switching element corresponding to the pixel electrode when two-dimensionally viewed.

Thereby, the active-matrix device can have an improved aperture ratio.

In the active-matrix device according to the first aspect, preferably, the first wiring includes a plurality of first wirings provided mutually in parallel along the substrate; the second wiring includes a plurality of second wirings intersecting with the first wirings and provided mutually in parallel along the substrate; and the each switching element is provided near an intersection between each of the first wirings and each of the second wirings.

This enables the switching elements to be disposed so as to correspond to the pixel electrodes arranged in a matrix.

An electro-optical display device according to a second aspect of the invention includes the active-matrix device according to the first aspect.

In this manner, there can be provided an electro-optical display device that is highly reliable and achieves high-definition image display.

An electronic apparatus according to a third aspect of the invention includes the electro-optical display device according to the second aspect.

In this manner, there can be provided an electronic apparatus that is highly reliable and can display high-definition images.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to accompanying drawings.

Figure 1:
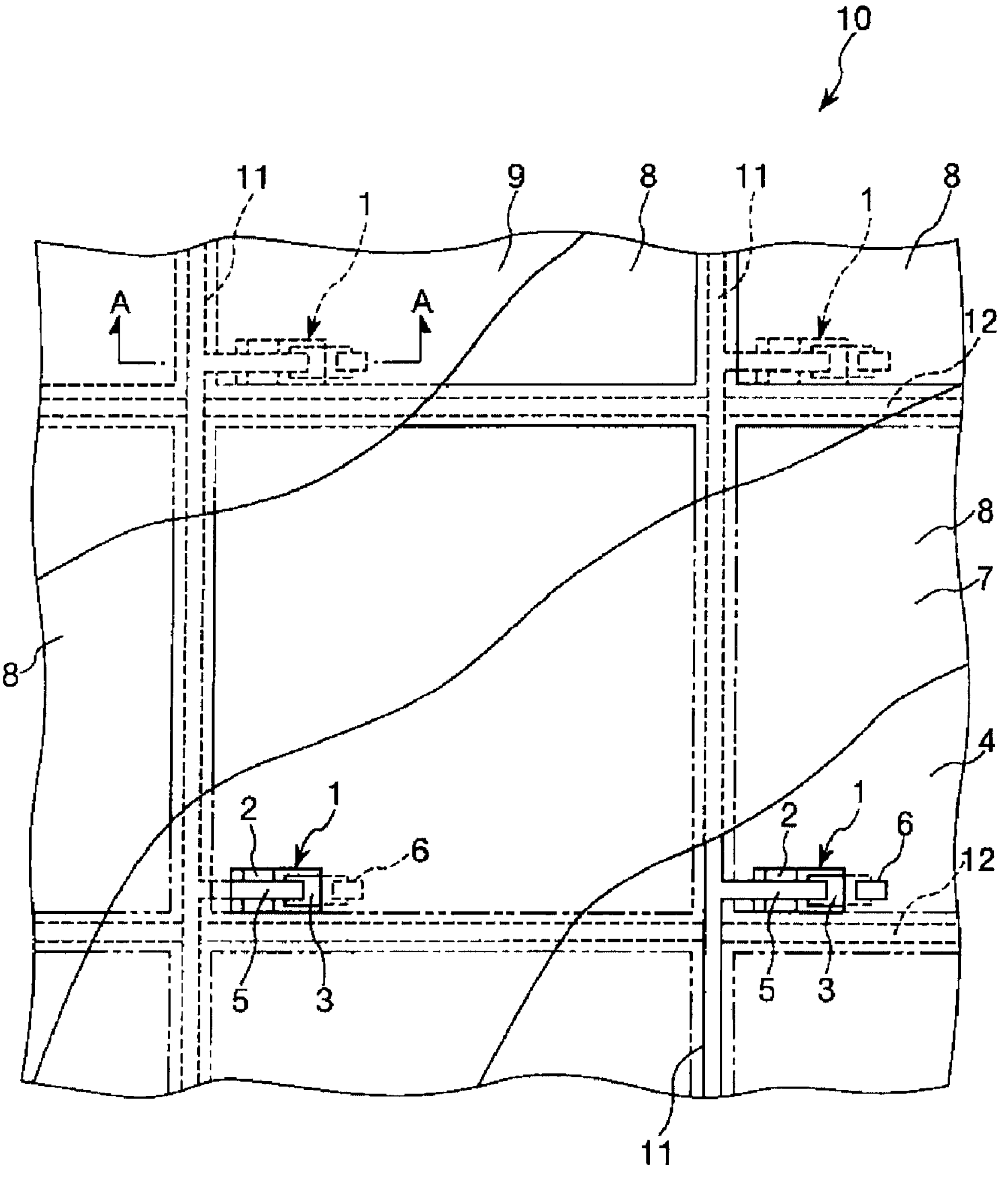
FIG. 1 is a plan view of an active-matrix device according to an embodiment of the invention.
Figure 2:
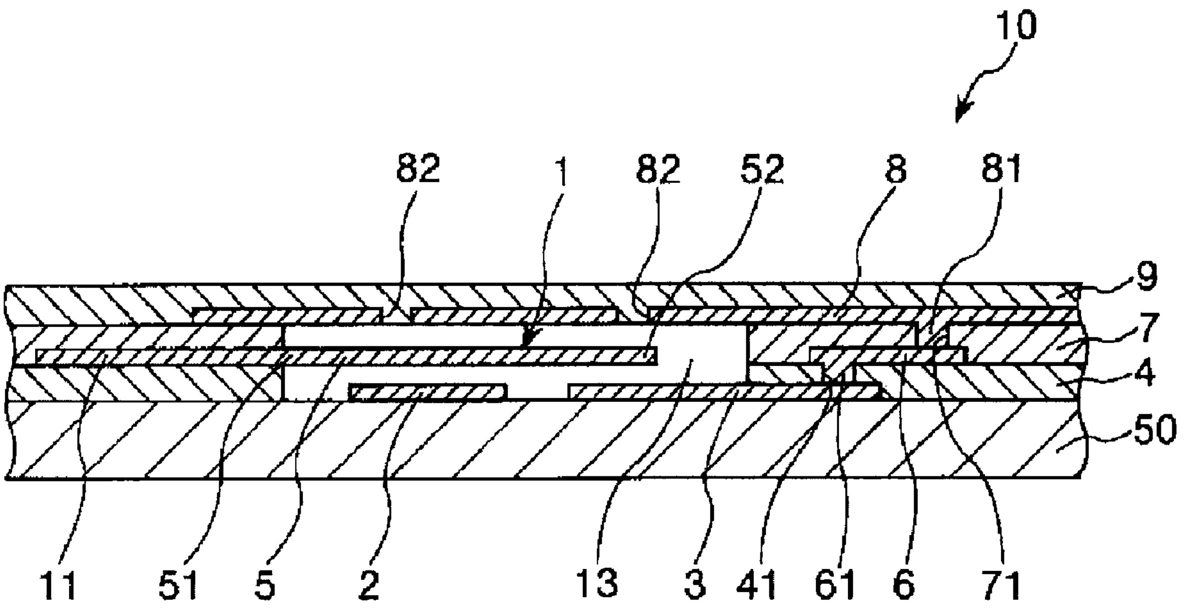
FIG. 2 is a sectional view taken along a line A-A of FIG. 1.
Figure 3:
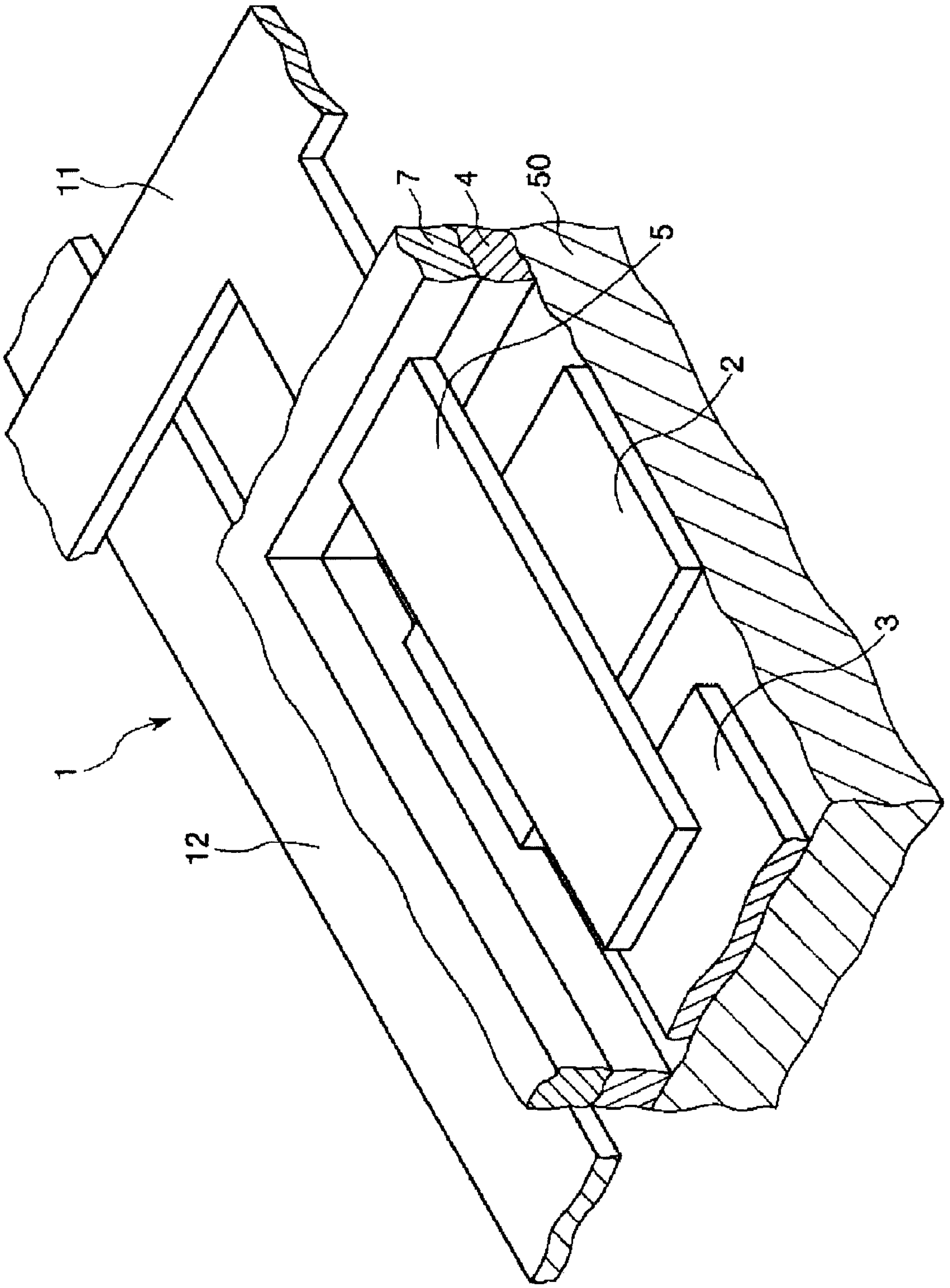
FIG. 3 is a perspective view illustrating a switching element shown in FIG. 2.
Figure 4:
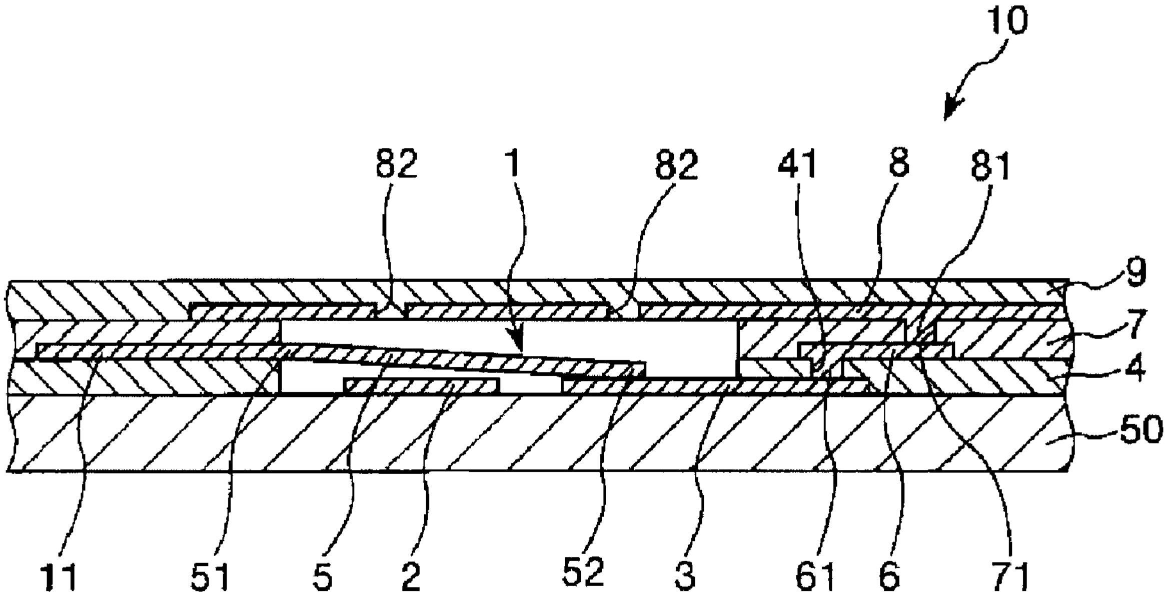
FIG. 4 is a diagram illustrating actuation of the switching element shown in FIG. 2.

FIG. 1 is a plan view showing an active-matrix device according to a first embodiment of the invention. FIG. 2 is a sectional view taken along a line A-A of FIG. 1. FIG. 3 is a perspective view illustrating a switching element shown in FIG. 2. FIG. 4 is a diagram illustrating actuation of the switching element shown in FIG. 2. In the description below, for descriptive convenience, a front and a rear side, and a right and a left side, respectively, on the page of FIG. 1 will be referred to as "top" and "bottom", "right" and "left", respectively. Additionally, an upper and a lower side, and a right and a left side, respectively, in FIGS. 2 and 4 will be referred to as "top" and "bottom", "right" and "left", respectively.

Active-Matrix Device

An active-matrix device 10 shown in FIG. 1 includes a plurality of first wirings 11, a plurality of second wirings 12 provided so as to intersect with the first wirings 11, a plurality of switching elements 1, each of which is provided near an intersection of each of the first wiring 11 and each of the second wirings 12, and a plurality of pixel electrodes 8 provided to correspond to each of switching elements 1. The first and the second wirings 11, 12, the switching elements 1, and the pixel electrodes 8 are arranged on and above a first surface of the substrate 50.

The substrate 50 is a supporting body that supports respective sections (respective layers) included in the active-matrix device 10.

For example, the substrate 50 may be made of any one of glass, a plastic (resin) such as polyimide, polyethylene terephthalate (PET), polyethylene naphthalate (PEN), polymethyl methacrylate (PMMA), polycarbonate (PC), polyethersulfone (PES), or aromatic polyester (liquid crystal polymer), quartz, silicon, gallium arsenide, etc.

A mean thickness of the substrate 50 slightly varies depending on a material for forming the substrate and the like, and is not specifically restricted. Preferably, the mean thickness of the substrate 50 is in a range of approximately 10to 2,000 micrometers, and more preferably, approximately 30 to 300 micrometers. An excessively thin thickness of the substrate 50 reduces strength of the substrate, so that the substrate 50 is unlikely to serve as the supporting body. Conversely, the substrate 50 having an excessively large thickness is unfavorable in terms of weight reduction.

The first wirings 11 are provided mutually in parallel along the substrate 50. The second wirings 12 intersecting with the first wirings 11 are also provided mutually in parallel along the substrate 50.

In the present embodiment, the first and the second wirings 11 and 12 are arranged so as to mutually intersect. The first wirings 11 are used for row selection, whereas the second wirings 12 are used for column selection. Specifically, either one of the first wirings 11 or the second wirings 12 are data lines, and the other thereof are scan lines. Thus, selecting a row and a column by using the first and the second wirings 11 and 12 allows a desired one of the switching elements 1 to be selectively actuated (where a voltage is applied between a movable electrode 5 and a driving electrode 2).

Near the intersection of each first wiring 11 and each second wiring 12 arranged as above is disposed each switching element 1. Thereby, the switching elements 1 can be arranged so as to correspond to the pixel electrodes 8 arranged in a matrix.

A material for forming each of the first and the second wirings 11 and 12 is not specifically restricted as long as the materials have conductivity. Examples of the materials include conductive materitals such as Pd, Pt, Au, W, Ta, Mo, Al, Cr, Ti, Cu, and alloys thereof, conductive oxides such as ITO, FTO, ATO, and $SnO_2$, carbon materials such as carbon black, carbon nanotube, and fullerene, conductive high polymers such as polyacetylene, polypyrrole, polythiophene such as poly-ethylene dioxythiophene (PEDOT), polyaniline, poly (p-phenylene), polyfluorene, polycarbazole, polysilane, and derivatives thereof. Among them, a single kind or a combination of two or more kinds may be used as the material for the wirings 11 and 12. The foregoing conductive high polymers are usually used by being doped with a high polymer such as an iron oxide, iodine, inorganic acid, organic acid, or polystyrene sulfonic acid to provide conductivity.

Among those mentioned above, a preferable material of each of the first and the second wirings 11 and 12 may be mainly made of Al, Au, Cr, Ni, Cu, Pt, or an alloy of any thereof. Using any one of the metal materials enables the first and the second wirings 11 and 12 to be easily formed at a low cost by electrolytic or electroless plating. Additionally, characteristics of the active-matrix device 10 can be improved.

In the present embodiment, on the first surface (a top surface) of the substrate 50 are provided the second wirings 12, as well as is provided a first insulating layer 4 to cover the second wirings 12. On an opposite surface (a top surface) of the first insulating layer 4 from the substrate 50 are provided the first wirings 11 and a conductive layer 6. Additionally, a second insulating layer 7 is also provided on the top surface of the first insulating layer 4 to cover the first wirings 11 and the conductive layer 6.

A part of each of the first and the second insulating layers 4 and 7 is removed to form a storage space (a region formed after the removal) 13 that stores a driving portion of the switching element 1 described below.

In the first insulating layer 4 is formed a through-hole (a contact hole) 41 used for a connection to the conductive layer 6 as described below. Additionally, in the second insulating layer 7 is formed a through-hole (a contact hole) 71 that connects the second insulating layer 7 to each pixel electrode 8 as described below.

A material for forming each of the first and the second insulating layers 4 and 7 is not specifically restricted as long as the material has insulation properties, and may be selected from various organic materials (particularly organic high polymers) and inorganic materials.

Examples of insulating organic materials include acrylic resins such as polystyrene, polyimide, polyamide-imide, polyvinyl phenylene, polycarbonate (PC), and polymethylmetacrylate (PMMA), fluororesins such as polytetra-fluoroethylene (PTFE), phenolic resins such as polyvinyl phenol and novolac resin, and olefin resins such as polyethylene, polypropylene, polyisobutylene, and polybutene. Among those examples, a single kind or a combination of two or more kinds of the materials may be used.

Meanwhile, as insulating inorganic materials, for example, there may be mentioned metallic oxides such as silica ($SiO_2$), silicon nitride, aluminum oxide, and tantalum oxide, and metallic compound oxides such as barium strontium titanate and lead zirconium titanate. Among them, a single kind or a combination of two or more kinds of the materials may be used.

The conductive layer 6 is disposed to electrically connect a fixed electrode 3 to the pixel electrode 8.

The conductive layer 6 used as above has a penetrating electrode portion 61 inserted into a through-hole 41 of the first insulating layer 4, thereby electrically connecting the conductive layer 6 to the fixed electrode 3 described below.

A material for forming the conductive layer 6 is not specifically restricted as long as the material has conductivity. For example, the conductive layer 6 may be made of the same material as that of the first and the second wirings 11 and 12 described above.

Each pixel electrode 8 is disposed above the first surface of the substrate 50 described above. The pixel electrode 8 is a first electrode that applies a voltage for driving each pixel in a below-described liquid crystal panel 100 constructed by incorporating the active-matrix device 10.

In the present embodiment, when two-dimensionally viewed, the pixel electrode 8 is arranged in a region surrounded by mutually adjacent two first wirings 11 and mutually adjacent second wirings 12.

Particularly, each of the pixel electrodes 8 is located in a position different from (upper than) a position of each of the switching elements 1 in a thickness direction of the substrate 50. Thus, when two-dimensionally viewed, the each pixel electrode 8 is located so as to cover the switching element 1 corresponding to the pixel electrode. This structure can maximize an area of each pixel electrode 8, thus improving an aperture ratio of the panel.

As a material of the pixel electrode 8, for example, there may be mentioned a metal such as Ni, Pd, Pt, Li, Mg, Ca, Sr, La, Ce, Er, Eu, Sc, Y, Yb, Ag, Cu, Co, Al, Cs, or Rb, an alloy such as MgAg, AlLi, or CuLi containing them, or an oxide such as indium tin oxide (ITO), $SnO_2$, $SnO_2$ containing Sb, or ZnO containing Al. Among them, a single kind or a combination of two or more kinds of the materials may be used. Particularly, when the active-matrix device 10 is incorporated in a transmissive liquid crystal panel 100 described below, the pixel electrode 8 may be made of a transparent material selected from those above.

Additionally, the pixel electrode 8 has a penetrating electrode portion 81 inserted into a through-hole 71 of the second insulating layer 7, thereby electrically connecting the pixel electrode 8 to the conductive layer 6.

A part of a bottom surface of each pixel electrode 8 (a surface thereof opposing the substrate 60) forms a part of a wall surface of the storage space 13 described above. In the pixel electrode 8 is formed a through-hole 82. The through-hole 82 is used to supply an etching liquid when forming the storage space 13 in a production process of the active-matrix device described below. The through-hole 82 is sealed with a sealing layer 9.

A material for forming the sealing layer 9 is not specifically restricted as long as the material can seal the through-hole 82, and may be selected from various organic or inorganic materials. Preferably, there may be mentioned high polymers such as polyimide resins, polyamideimide resins, polyvinyl alcohols, and polytetrafluoroethylenes. The sealing layer made of any one of the high polymers can also serve as an alignment film of the liquid crystal panel 100 described below.

The each pixel electrode 8 formed as above is connected to the switching element 1 arranged corresponding to the pixel electrode 8 via the conductive layer 6. Controlling actuation of the switching element 1 allows control of driving of each pixel in the liquid crystal panel 100 described below.

As shown in FIGS. 2 and 3, each switching element 1 includes the driving electrode 2 electrically connected to the corresponding second wiring 12, the fixed electrode 3 electrically connected to the corresponding pixel electrode 8, and the movable electrode (a switching piece) 5 electrically connected to the corresponding first electrode 11.

Next, each section included in the switching element 1 will be sequentially described in detail.

The driving electrode 2 is formed so as to protrude laterally from each second wiring 12 and is provided on the first surface (the top surface) of the substrate 50. The driving electrode 2 is arranged on an opposite side of an electrostatic gap from the movable electrode 5.

When a voltage is applied (a potential difference is generated) between the driving electrode 2 and the movable electrode 5, an electrostatic attraction (the electrostatic gap) is generated between the electrodes 2 and 5.

The driving electrode 2 formed as above is electrically connected to the second wiring 12. In the present embodiment, the second wiring 12 is formed on the top surface of the substrate 50 (namely, on the same surface as the driving electrode 2 is provided), where the driving electrode 2 and the second wiring 12 are integrally formed with each other.

A material of the driving electrode 2 is not specifically restricted as long as the material has conductivity, and may be the same as that of the first and the second wirings 11 and 12, for example.

A thickness of the driving electrode 2 is also not restricted to a specific size. The electrode 2 has a thickness preferably ranging from approximately 10 to 1,000 nanometers, and more preferably ranging from approximately 50 to 500 nanometers.

The fixed electrode 3 is spaced apart from the driving electrode 2 by a gap on the first surface (the top surface) of the substrate 50.

The fixed electrode 3 is brought in contact with the movable electrode 5 to thereby be electrically connected to the first wiring 12.

Additionally, the fixed electrode 3 provided as above is electrically connected to the pixel electrode 8 via the conductive layer 6.

A material of the fixed electrode 3 is not specifically restricted as long as the material has conductivity, and may be the same as that of the first and the second wirings 11 and 12, for example.

Additionally, a thickness of the fixed electrode 3 is also not specifically restricted. The thickness thereof is preferably in a range of approximately 10 to 1,000 nanometers, and more preferably in a range of approximately 50 to 500 nanometers.

The movable electrode 5 is formed so as to protrude laterally from each of the first wirings 11 and is provided opposing the driving electrode 2 and the fixed electrode 3.

The movable electrode 5 has a belt-like shape. An end 51 of the movable electrode 5 on the first insulating layer 4 side in a length direction of the belt-like shape (the end thereof on the left in FIG. 2) is fixed to cantilever-support the movable electrode 5. This allows a free end 52 of the movable electrode 5 to be displaced (downwardly) to the driving electrode 2 and the fixed electrode 3.

In this manner, the movable electrode 5 is displaceably provided so as to contact with and separate from the fixed electrode 3.

The movable electrode 5 formed as above is mainly made of a silicon such as monocrystalline silicon, polycrystalline silicon, amorphous silicon, or silicon carbide. The movable electrode 5 mainly made of such a material is conductive and elastically deformable.

The silicon material doesn't fatigue like metal. Thus, using the movable electrode 5 mainly made of silicon enables the switching element 1 to exhibit stable switching characteristics over a long period of time.

Furthermore, a main body of the movable electrode 5 is preferably made of monocrystalline silicon. In other words, preferably, the movable electrode 5 is composed of a monocrystalline silicon layer. This provides excellent mechanical characteristics to the movable electrode 5.

A silicon layer made of monocrystalline silicon can be formed by annealing after deposition of an amorphous silicon film, as will be described below. With the monocrystalline silicon layer formed as above, the movable electrode 5 can be formed with a high precision. Additionally, the switching element 1 can be miniaturized.

Furthermore, an impurity such as boron or phosphorus can be doped into the movable electrode 5 mainly made of silicon. This can improve conductivity of the movable electrode 5, thereby reducing a driving voltage of the switching element 1 and improving switching characteristics of the switching element 1.

Even when a thin film made of a highly conductive material (a material more highly conductive than silicon), like the foregoing material of the first wiring 11, is formed on the movable electrode 5 (on the silicon layer), the conductivity of the movable electrode 5 can be improved, so as to reduce the driving voltage of the switching element 1 and to improve the switching characteristics of the switching element 1. In this case, preferably, the thin film is made of the same kind of material as that of the first wiring 11, among those like the foregoing material examples for forming the first wiring 11. This can relatively easily provide an excellent mechanical strength at a boundary between the thin film and the first wiring 11.

In the embodiment, the driving electrode 2, the fixed electrode 3, and the movable electrode 5 are stored in the storage space 13 formed between the pixel electrode 8 and the substrate 50.

An inside of the storage space 13 may be kept under reduced pressure, or may be filled with either a nonacid gas or an insulating liquid.

In each switching element 1 structured as above, when no voltage is applied between the movable electrode 5 and the driving electrode 2, the movable electrode 5 and the fixed electrode 3 are separated from each other, as shown in FIGS. 2 and 3. Thus, electricity does not flow from the first wiring 11 to the pixel electrode 8.

Then, applying a voltage between the movable electrode 5 and the driving electrode 2 leads to generation of the electrostatic attraction between the electrodes 5 and 2, thereby causing the movable electrode 5 to contact with the fixed electrode 3, as shown in FIG. 4. This results in allowing electricity to flow from the first wiring 11 to the pixel electrode 8.

The switching element 1 having such mechanical characteristics exhibits a higher light resistance than a thin film transistor (TFT). Additionally, unlike the TFT, the switching element 1 does not cause light leakage. Accordingly, no light-shielding layer such as a black matrix is needed to shield light from the switching element 1, which thus increases an aperture ratio of the active-matrix device 10. Additionally, the switching element 1 does not cause temperature-related characteristic fluctuations, thus enabling simplification of a cooling mechanism in the active-matrix device 10. Moreover, the switching element 1 realizes higher-speed switching performance as compared to the TFT.

In addition, using the movable electrode 5 mainly made of silicon, as described above, enables the switching element 1 to exhibit stable switching characteristics over a long period of time.

Consequently, the active-matrix device 10 can be made highly reliable and can have an improved aperture ratio.

In the embodiment, as described above, the movable electrode 5 is cantilever-supported to displace a side of the movable electrode 5 having the free end 52. The fixed electrode 3 is arranged so as to oppose an end region on the side of the movable electrode 5 having the free end 52. The driving electrode 2 is arranged relative to the fixed electrode 3 so as to oppose a region on a side of the movable electrode 5 having the fixed end 51. As shown in FIG. 4, the fixed electrode 3, the driving electrode 2, and the movable electrode 5 are arranged such that the movable electrode 5 contacts with the fixed electrode 3 while remaining separated from the driving electrode 2. This can prevent adhesion between the movable electrode 5 and the driving electrode 2.

In particular, due to the cantilever-supported structure of the movable electrode 5 as described above, the switching element 1 can be made into a simple structure. Additionally, the driving electrode 2 opposes the region on the side of the movable electrode 5 having the fixed end 51. This generates a large reaction force allowing the movable electrode 5 to return to an initial state when the movable electrode 5 is displaced (bendingly deformed) to the driving electrode 2, thereby ensuring prevention of the adhesion between the driving electrode 2 and the movable electrode 5.

Method for Producing the Active-Matrix Device

Next will be described an example of a method for producing the active-matrix device 10 according to the first embodiment, with reference to FIGS. 5A to 5D and FIGS. 6A to 6D.

FIGS. 5A to 5D and FIGS. 6A to 6D sequentially illustrate a method for producing the active-matrix device 10 (a method for producing each switching element) shown in FIGS. 1 and 2. In the description below, for descriptive convenience, an upper and a lower side, and a right and a left side, respectively, in FIGS. 5A to 5D and FIGS. 6A to 6D will be referred to as "top" and "bottom", and "right" and "left", respectively.

The method for producing the active-matrix device 10 includes (A) forming the driving electrode 2 and the fixed electrode 3 on the substrate 50, (B) forming a first insulating film to be the first insulating layer 4, (C) forming the movable electrode 5 and the conductive layer 6 on the first insulating film, (D) forming a second insulating film to be the second insulating layer 7, (E) forming the pixel electrode 8 on the second insulating film, (F) forming the first and the second insulating layers 4 and 7 by removing a part of each of the first and the second insulating films to form the storage space 13, and (G) forming the sealing layer 9.

Each step will be sequentially described in detail below.

Step A

Figure 5A:
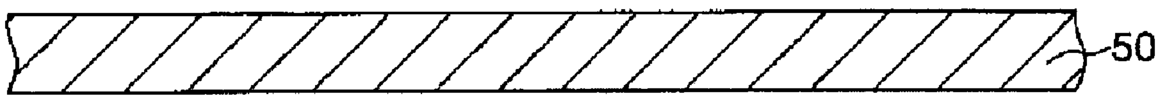
FIGS. 5A to 5D are diagrams illustrating a method for producing the active-matrix device shown in FIG. 1.
Figure 5B:
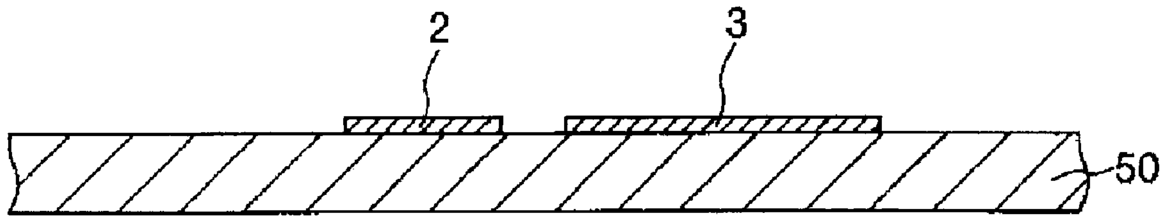

First, as shown in FIG. 5A, the substrate 50 is prepared. On the substrate 50 are formed the driving electrode 2 and the fixed electrode 3, as shown in FIG. 5B. Although not shown in the drawing, the second wiring 12 is also formed simultaneously with the formation of the driving electrode 2 and the fixed electrode 3. Hereinafter, the driving electrode 2, the fixed electrode 3, and the second wiring 12 are together referred to as "the driving electrode 2, the fixed electrode 3, and the like".

For example, to form the driving electrode 2, the fixed electrode 3, and the like, first, a metal film (a metal layer) is formed on the substrate 50.

A material for forming the metal film is not specifically restricted and may be the same as that of the driving electrode 2 and the fixed electrode 3 described above.

Additionally, the metal film can be formed by any one of chemical vapor deposition (CVD) processes such as plasma CVD, thermal CVD, and laser CVD, dry plating process such as vacuum evaporation, sputtering (low-temperature sputtering), and ion plating, wet plating processes such as electrolytic plating, immersion plating, and electroless plating, spraying, sol-gel processes, metal organic deposition (MOD) processes, and bonding of metal foil, for example.

On the metal film is formed a resist layer shaped so as to correspond to a shape of each of the driving electrode 2, the fixed electrode 3, and the like by photolithography. The resist layer is used as a mask to remove unnecessary parts of the metal film.

To remove the above parts of the metal film, for example, there may be used a single kind of process or a combination of two or more kinds of processes selected from physical processes such as plasma etching, reactive etching, beam etching, and photo-assisted etching, chemical etching processes such as wet etching, and the like.

Then, after removing the resist layer, the driving electrode 2, the fixed electrode 3, and the like can be obtained, as shown in FIG. 5B.

Alternatively, the driving electrode 2, the fixed electrode 3, and the like may be formed as follows. For example, a liquid material such as a colloid liquid (a dispersion liquid) containing conductive microparticles or a liquid (a solution or a dispersion liquid) containing conductive polymer particles is applied on the substrate 50 to form a coating film. Then, if needed, post-processing (e.g. heating, infrared ray irradiation, or ultrasonic application) is performed on the coating film.

Step B

Figure 5C:
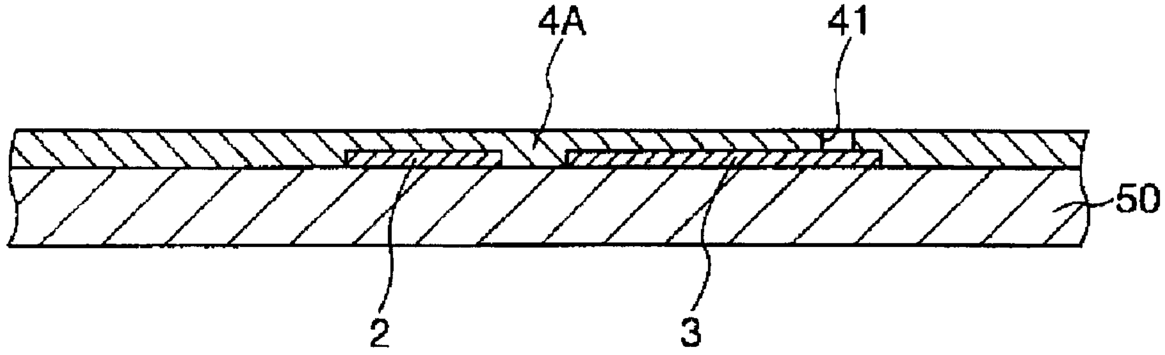

Next, as shown in FIG. 5C, a first insulating film 4A having the through-hole 41 is formed so as to cover the driving electrode 2, the fixed electrode 3, and the like.

The first insulating film 4A is formed into the first insulating layer 4 at step F described below.

For example, the first insulating film 4A made of an organic insulating material is formed as follows. First, the organic insulating material or a precursor of the material is applied (supplied) to cover the driving electrode 2, the fixed electrode 3, and the like, so as to form a coating film. Thereafter, if needed, post-processing (e.g. heating, infrared ray irradiation, or ultrasonic application) is performed on the coating film. Next, a mask having an aperture at a portion corresponding to the through-hole 41 is formed by photolithography, as in step B described above, and then etching is performed on the film via the mask, thereby resulting in formation of the first insulating film 4A.

A method for applying (supply) the solution composed of any organic insulating material or any precursor thereof on the substrate 50 may be coating, printing, or the like.

Meanwhile, the first insulating film 4A made of an inorganic material can be formed by thermal oxidation, a CVD process, a spin-on-glass (SOG) process, or the like, for example. In addition, using polysilazane as a raw material enables deposition of a silica film or a silicon nitride film as the first insulating film 4A by a wet process.

Step C

Figure 5D:
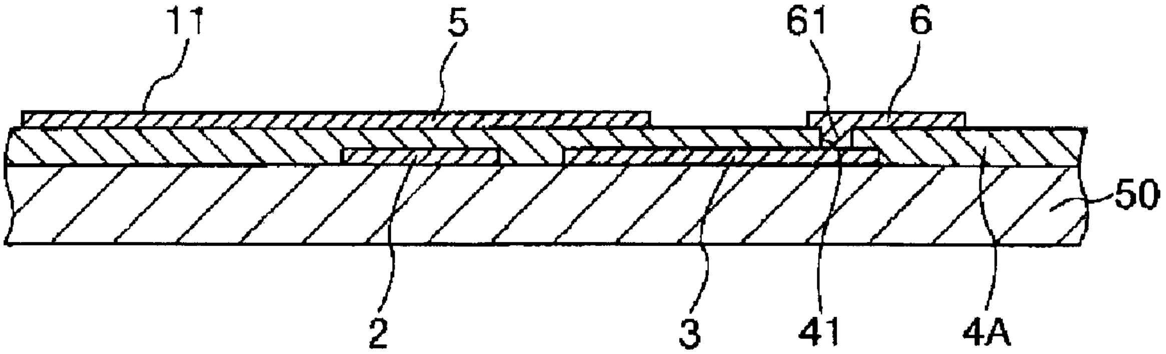

Next, there are formed the first wiring 11, the movable electrode 5, and the conductive layer 6, as shown in FIG. 5D. On this occasion, a penetrating electrode portion 61 of the conductive layer 6 is formed inside the through-hole 41 to electrically connect the fixed electrode 3 to the conductive layer 6. Hereinafter, the first wiring 11, the movable electrode 5, and the conductive layer 6 are together referred to as "the movable electrode 5, the conductive layer 6, and the like".

The movable electrode 5, the conductive layer 6, and the like can be formed in the same manner as in step A described above. When forming the movable electrode 5 mainly made of silicon, for example, after a material of Al—Si (2%) is sputtered and amorphous silicon (α-Si) is sputtered, annealing is performed at approximately 300° to promote crystallization of a silicon monocrystalline film as an underlayer through the Al—Si material. Thereafter, the Al—Si material that has shifted to a top layer position is removed by etching to thereby obtain a silicon monocrystalline film, which, in turn, is etched in the same manner as in step A described above, resulting in formation of the movable electrode 5.

Step D

Figure 6A:
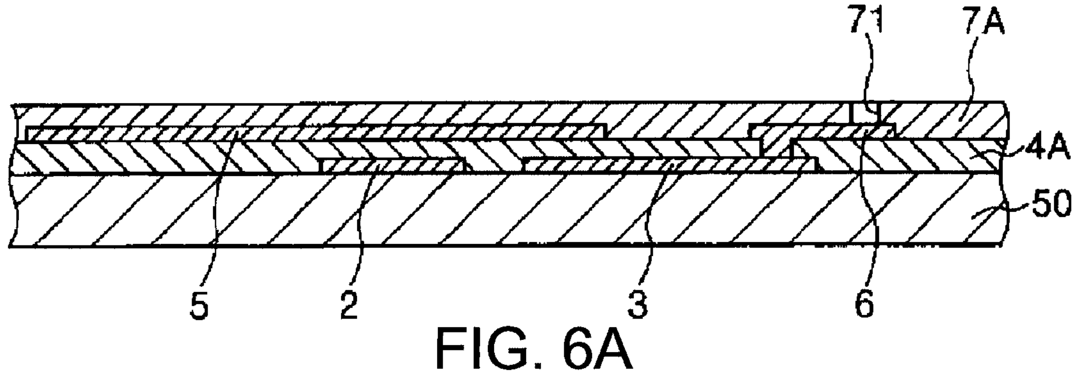
FIGS. 6A to 6D are also diagrams illustrating the method for producing the active-matrix device shown in FIG. 1

Next, as shown in FIG. 6A, the second insulating film 7A having the through-hole 71 is formed so as to cover the movable electrode 5, the conductive layer 6, and the like.

The second insulating film 7A is formed into the second insulating layer 7 at step F described below.

The second insulating film 7A formed above can be obtained in the same manner as in step B above.

Step E

Figure 6B:
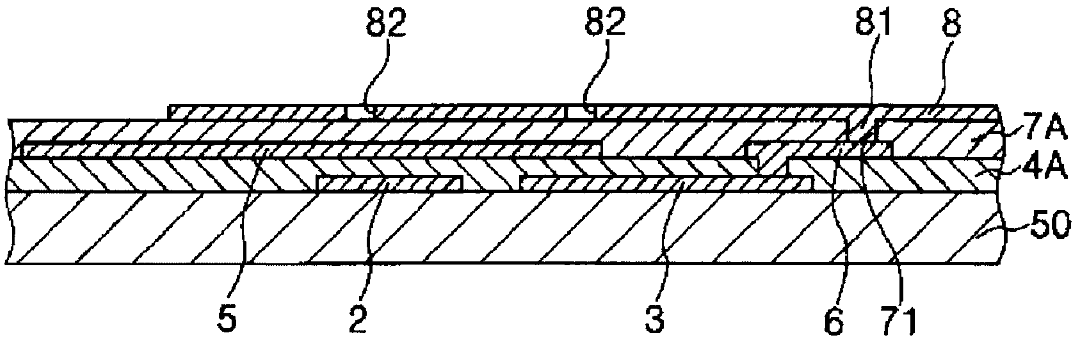

Next, there is formed the pixel electrode 8 having the through-hole 82, as shown in FIG. 6B.

The pixel electrode 8 can be formed in the same manner as in step A above.

Step F

Figure 6C:
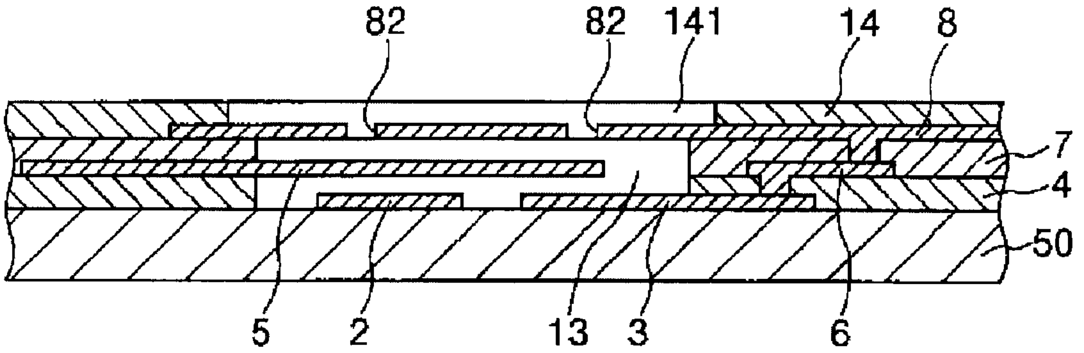

Next, as shown in FIG. 6C, a mask 14 having an aperture 141 is formed to expose the through-hole 82 of the pixel electrode 8. Then, wet etching is performed via the mask 14 to remove parts of the first and the second insulating films 4A and 7A so as to form the first and the second insulating layers 4 and 7. This results in formation of the storage space 13 storing the driving electrode 2, the fixed electrode 3, and the movable electrode 5.

Step G

Figure 6D:
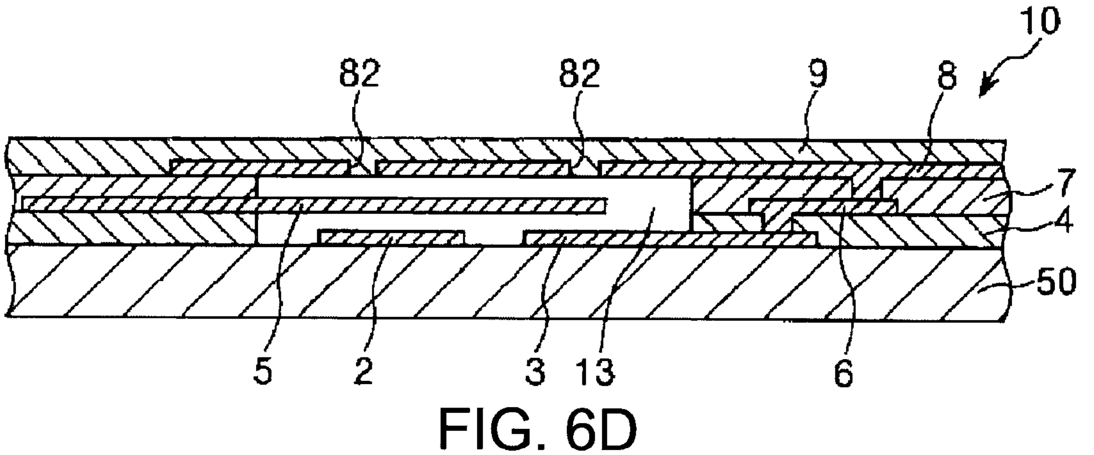

Next, after removing the mask 14, the sealing layer 9 is formed to cover the pixel electrodes 8, as shown in FIG. 6D. As a result, the active-matrix device 10 (the switching element 1) can be obtained.

Thus, the active-matrix device 10 can be produced through the steps as described hereinabove.

Electro-Optical Display Device

Next will be described a liquid crystal panel including the foregoing active-matrix device 10, as an example of an electro-optical display device according to an embodiment of the invention.

Figure 7:
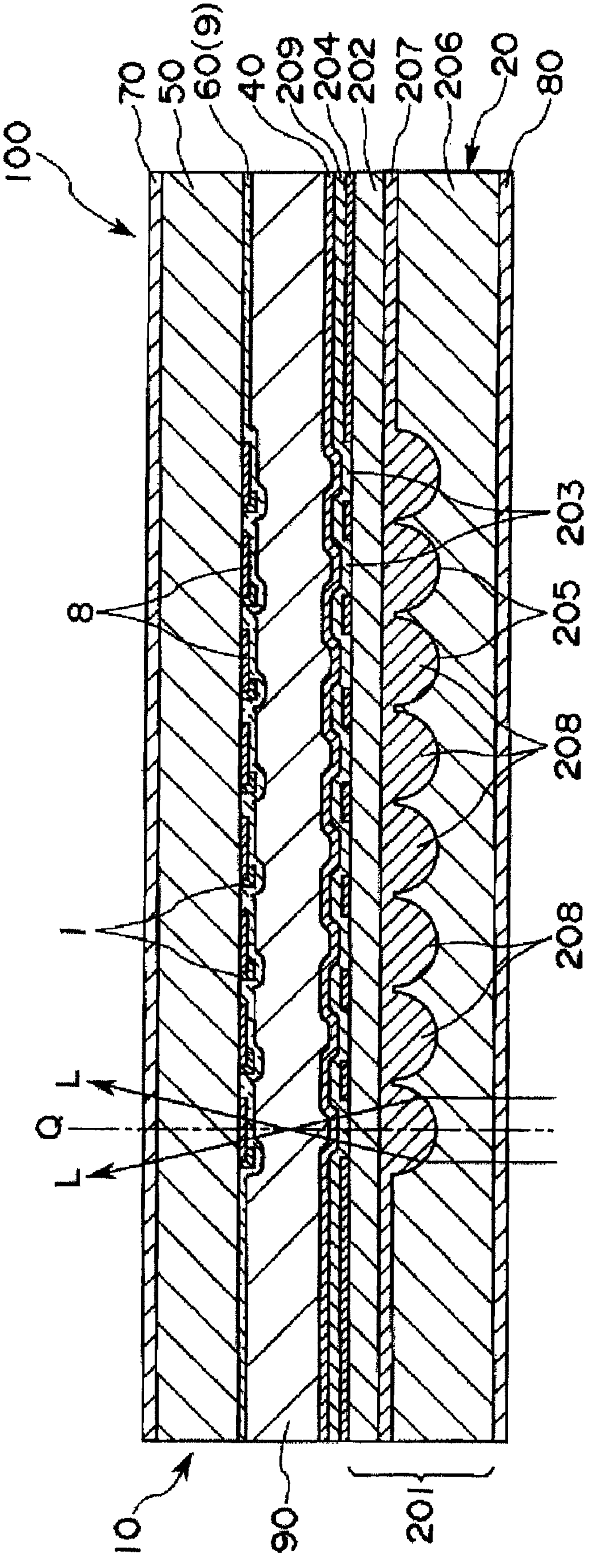
FIG. 7 is a longitudinal sectional view showing a structure of a liquid crystal panel as an example of an electro-optical display device according to an embodiment of the invention.

FIG. 7 is a longitudinal sectional view of the embodiment in which the electro-optical display device of the embodiment is applied to the liquid crystal panel.

As shown in FIG. 7, a liquid crystal panel 100 as the electro-optical display device of the embodiment includes the active-matrix device 10, an alignment film 60 bonded to the active-matrix device 10, an opposing substrate 20 for a liquid crystal panel, an alignment film 40 bonded to the opposing substrate 20 for a liquid crystal display, a liquid crystal layer 90 composed of liquid crystal sealed in a space between the alignment films 60 and 40, a polarizing film 70 bonded to an outer surface (a top surface) of the active-matrix device (a liquid crystal driving device) 10, and a polarizing film 80 bonded to an outer surface (a bottom surface) of the opposing substrate 20 for a liquid crystal panel.

The opposing substrate 20 for a liquid crystal panel includes a microlens substrate 201, a black matrix 204 provided on a top layer 202 of the microlens substrate 201 and having an aperture 203, and a transparent conductive film (a common electrode) 209 provided to cover the black matrix 204 on the top layer 202.

The microlens substrate 201 includes a substrate (a first substrate) 206 having a plurality of (many) concave portions 205 for microlenses, each of the concave portions 205 having a concave curved surface, and the top layer 202 bonded to a surface of the substrate 206 having the for-microlens concave portions 205 via a resin layer (an adhesive layer) 207. On the resin layer 207 are formed microlenses 208 by filling the concave portions 205 with resin.

The active-matrix device 10 serves to drive the liquid crystal of the liquid crystal layer 90.

The switching element 1 included in the active-matrix device 10 is connected to a not-shown controlling circuit to control electric current supplied to the pixel electrodes 8, thereby controlling charging and discharging of the pixel electrodes 8.

The alignment film 60 is bonded to the pixel electrodes 8 of the active-matrix device 10, whereas the alignment film 40 is bonded to the liquid crystal layer 90 of the opposing substrate 20 for a liquid crystal panel. The alignment film 60 serves also as the sealing layer 9 of the active-matrix device 10.

The alignment films 40 and 60 regulate aligning conditions of liquid crystal molecules constituting the liquid crystal layer 90 when no voltage is applied.

A material of each of the alignment films 40 and 60 is not specifically restricted and is usually mainly made of a high polymer such as a polyimide resin, a polyamide-imide resin, a polyvinyl alcohol, and a polytetrafluoroethylene resin. Among the above high polymers, particularly, polyimide resins and polyamide-imide resins are preferable. When each of the alignment films 40 and 60 is mainly made of either a polyimide or polyamide-imide resin, it is easy to form a high polymer film in production steps, as well as the film can exhibit excellent thermal resistance, chemical resistance, and the like.

Usually, each of the alignment films 40 and 60 is formed by processing a film made of any of the foregoing materials so as to have an alignment function that regulates the alignment of the liquid crystal constituting the liquid crystal layer 90. To allow the film to have the aligning function, there may be used a rubbing process or a photo-alignment process, for example.

The alignment films 40 and 60 have, preferably, a mean thickness of 20 to 120 nanometers, and more preferably, a mean thickness of 30 to 80 nanometers.

The liquid crystal layer 90 contains liquid crystal molecules. Thus, the alignment of the liquid crystal molecules, namely, of the liquid crystal is changed in response the charging and the discharging of the pixel electrodes 8.

Any liquid crystal molecules may be used as the above liquid crystal molecules only if the molecules can align, like nematic liquid crystal molecules or smectic liquid crystal molecules, for example. In a case of a twisted nematic (TN) liquid crystal panel, it is preferable to use molecules forming nematic liquid crystal, such as molecules of phenyl cyclohexane derivative liquid crystal, biphenyl derivative liquid crystal, biphenyl cyclohexane derivative liquid crystal, terphenyl derivative liquid crystal, phenyl ether derivative liquid crystal, phenyl ester derivative liquid crystal, bicyclohexane derivative liquid crystal, azomethine derivative liquid crystal, azoxy derivative liquid crystal, pyrimidine derivative liquid crystal, dioxane derivative liquid crystal, or cubane derivative liquid crystal. Furthermore, among the above nematic liquid crystal molecules, there may be also used those containing fluoro substituents such as a monofluoro group, a difluoro group, a trifluoro group, a trifluoromethyl group, a trifluoromethoxy group, and a difluoromethoxy group.

In the liquid crystal panel 100 structured as above, usually, a single pixel corresponds to a structure including a single microlens 208, a single aperture 203 of the black matrix 204 corresponding to an optical axis Q of the single microlens 208, a single pixel electrode 8, and a single switching element 1 connected to the single pixel electrode 8.

An incident light L entering from the opposing substrate 20 for a liquid crystal panel passes through the substrate 206 with the for-microlens concave portions to be converged when passing through the microlenses 208, and transmits through the resin layer 207, the top layer 202, the aperture 203 of the black matrix 204, the transparent conductive film 209, the liquid crystal layer 90, the pixel electrode 8, and the substrate 50. In this case, since the polarizing film 80 is provided on a light-entering side of the microlens substrate 201, the incident light L transmitting through the liquid crystal layer 90 becomes a linearly polarized light. On this occasion, a polarizing direction of the incident light L is controlled in accordance with an aligning condition of the liquid crystal molecules in the liquid crystal layer 90. Accordingly, allowing the incident light L passing through the liquid crystal panel 100 to transmit through the polarizing film 70 enables control of brightness of a light emitted from the panel.

The liquid crystal panel 100 structured as above includes the microlenses 208 as described above. Thus, the incident light L transmitting through the microlenses 208 is converged to pass through the aperture 203 of the black matrix 204. Meanwhile, the incident light L is shielded in a region where there is formed no aperture 203 of the black matrix 204. Therefore, the liquid crystal panel 100 prevents leakage of an unnecessary light beam from the region except for the pixel, as well as suppresses attenuation of the incident light L in each pixel. As a result, the liquid crystal panel 100 has a high light transmittance in the pixels.

Thus, the liquid crystal panel 100 including the active-matrix device 10 as described above is highly reliable and provides a high-definition image display.

In addition, application of the electro-optical device according to the embodiment is not restricted to the liquid crystal panel as above. The electro-optical device may also be applied to electro-phoretic display devices, organic or inorganic EL display devices, etc.

Electronic Apparatuses

Next will be described electronic apparatuses including the foregoing liquid crystal panel 100, as examples of an electronic apparatus according to an embodiment of the invention, based on first to fourth examples shown in FIGS. 8 to 11.

FIRST EXAMPLE

Figure 8:
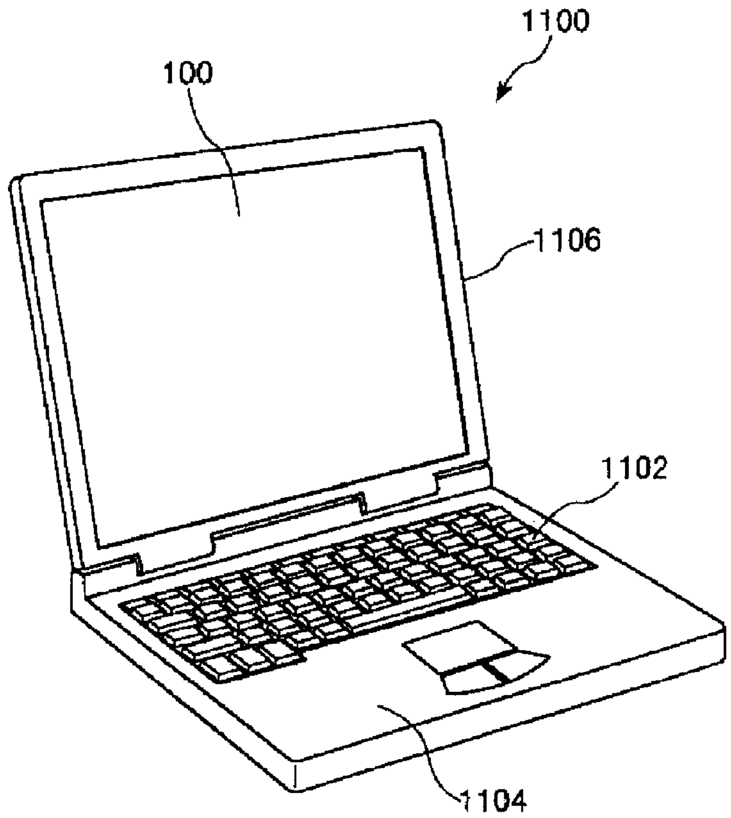
FIG. 8 is a perspective view showing a structure of a mobile (or notebook) personal computer as a first example of an electronic apparatus according to an embodiment of the invention.

FIG. 8 is a perspective view showing a structure of a mobile (or notebook) personal computer as the first example of the electronic apparatus according to the embodiment.

In the drawing, a personal computer 1100 includes a main body 1104 with a key board 1102 and a display unit 1106. The display unit 1106 is supported rotatably with respect to the main body 1104 via a hinged portion.

In the personal computer 1100, the display unit 1106 includes the foregoing liquid crystal panel 100 and a not-shown backlight. Light from the backlight is transmitted through the liquid crystal panel 100 to display images (data).

SECOND EXAMPLE

Figure 9:
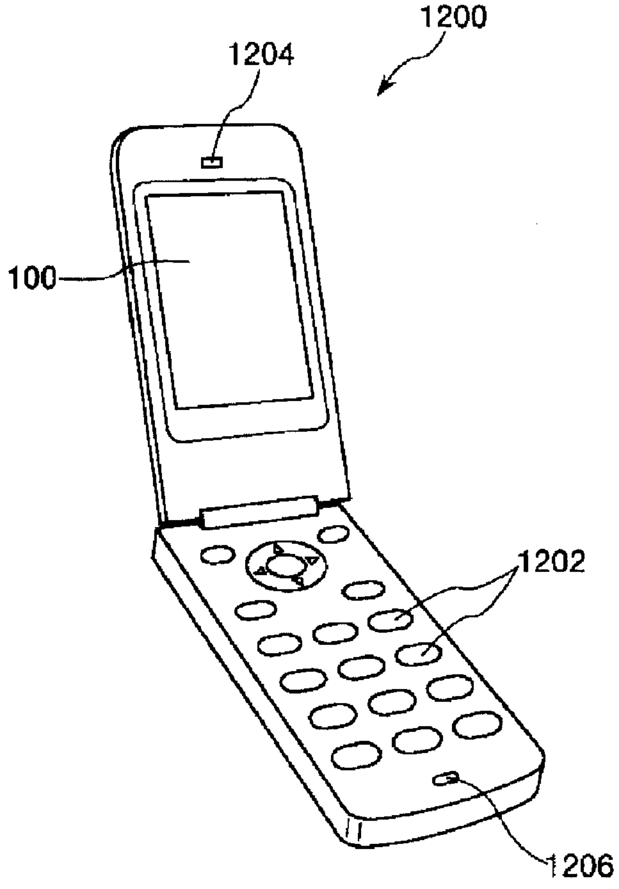
FIG. 9 is a perspective view showing a structure of a mobile phone (including a PHS) as a second example of the electronic apparatus according to the embodiment of the invention.

FIG. 9 is a perspective view showing a structure of a mobile phone (including a PHS) as the second example of the electronic apparatus according to the embodiment.

In FIG. 9, a mobile phone 1200 includes a plurality of operating buttons 1202, a receiver 1204, a microphone 1206, the liquid crystal panel 100, and a not-shown backlight.

THIRD EXAMPLE

Figure 10:
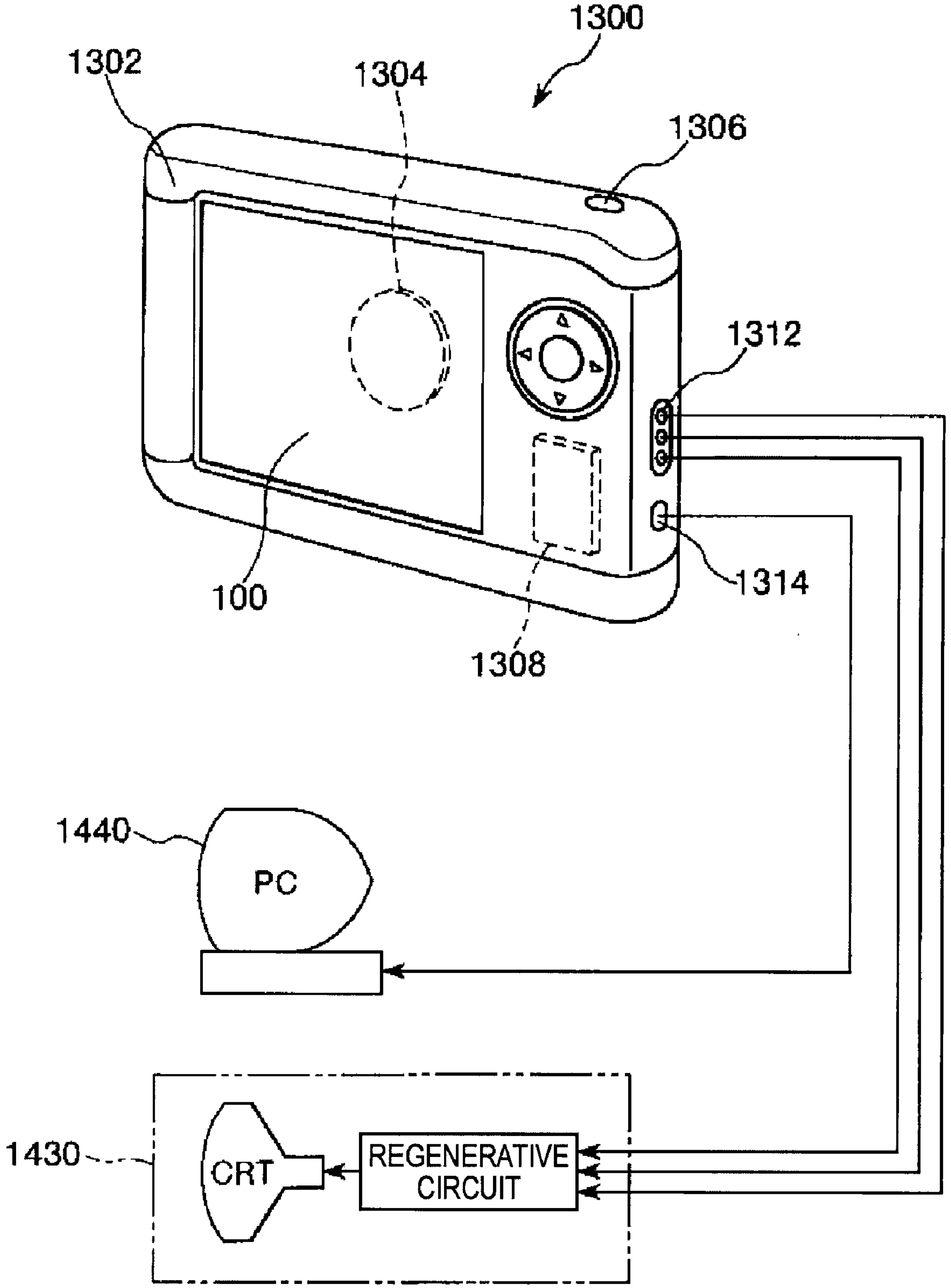
FIG. 10 is a perspective view showing a structure of a digital still camera as a third example of the electronic apparatus according to the embodiment of the invention.

FIG. 10 is a perspective view showing a structure of a digital still camera as the third example of the electronic apparatus according to the embodiment. In the drawing, connections with external apparatuses are simply added.

In an ordinary camera, a silver halide film is exposed to light of an optical image of an object, whereas a digital still camera 1300 generates an image-pickup signal (an image signal) by photoelectrically converting the optical image of an object by using an image-pickup element such as a charge coupled device (CCD).

On a rear surface of a casing (body) 1302 of the digital still camera 1300 are disposed the liquid crystal panel 100 and a not-shown backlight to display images based on image-pickup signals from the CCD. Thus, the liquid crystal panel 100 serves as a finder that displays an electronic image of the object.

Inside the casing is disposed a circuit substrate 1308. The circuit substrate 1308 includes a memory unit capable of storing (memorizing) image-pickup signals.

In addition, on a front surface of the casing 1302 (on a back surface of a structure in the drawing) is provided a light-receiving unit 1304 including an optical lens (an image-pickup optical system) and a CCD.

When a photo-taker checks an object image displayed on the liquid crystal panel 100 and then pushes down a shutter button 1306, an image signal from the CCD at the point in time is transferred to be stored in the memory unit of the circuit substrate 1308.

In addition, the digital still camera 1300 includes a video signal output terminal 1312 and a data communication input-output terminal 1314 that are provided on a side surface of the casing 1302. As shown in the drawing, the video signal output terminal 1312 is connected to a television monitor 1430, whereas the data communication input-output terminal 1314 is connected to a personal computer 1440, when needed, respectively. Furthermore, with a predetermined operation, the image-pickup signal stored in the memory unit of the circuit substrate 1308 is output to the television monitor 1430 or the personal computer 1440.

FOURTH EXAMPLE

Figure 11:
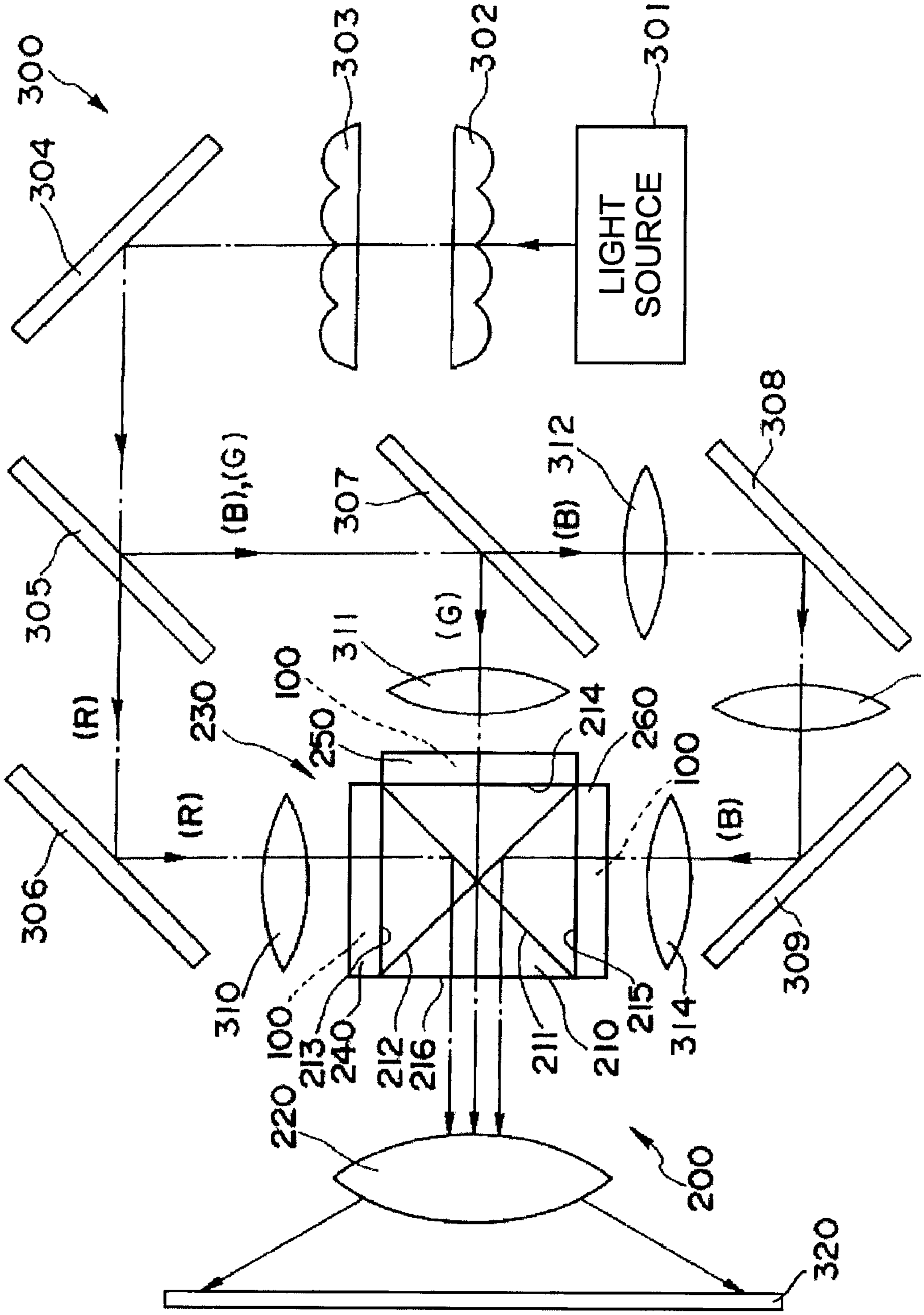
FIG. 11 is a schematic view showing an optical system of a projection-type display device as a fourth example of the electronic apparatus according to the embodiment of the invention.

FIG. 11 schematically illustrates an optical system of a projection-type display device (a liquid crystal projector) as the fourth example of the electronic apparatus according to the embodiment.

As shown in the drawing, a projection-type display device 300 includes a light source 301, an illumination optical system including a plurality of integrator lenses, a color-separating optical system (a light-guiding optical system) including a plurality of dichroic mirrors, a liquid crystal light valve (a liquid crystal light shutter array) 240 corresponding to red (used for red), a liquid crystal light valve (a liquid crystal light shutter array) 250 corresponding to green (used for green), a liquid crystal light valve (a liquid crystal light shutter array) 260 corresponding to blue (used for blue), a dichroic prism (a color-synthesizing optical system) 210 having a dichroic mirror surface 211 that reflects only red light and a dichroic mirror surface 212 that reflects only blue light, and a projection lens (a projection optical system) 220.

The illumination optical system has integrator lenses 302 and 303. The color-synthesizing optical system has mirrors 304, 306, and 309, a dichroic mirror 305 that reflects blue and green light (namely, which transmits only red light), a dichroic mirror 307 that reflects only green light, a dichroic mirror 308 that reflects only blue light (or a blue-light reflecting mirror), and converging lenses 310, 311, 312, 313, and 314.

The liquid crystal light valve 250 includes the foregoing liquid crystal panel 100. The liquid crystal light valves 240 and 260 have the same structure as that of the liquid crystal light valve 250. The liquid crystal panel 100 included in each of the liquid crystal light valves 240, 250, and 260 is connected to a not-shown driving circuit.

The projection-type display device 300 includes an optical block 200 that is composed of the dichroic prism 210 and the projection lens 220 and a display unit 230 that is composed of the optical block 200 and the liquid crystal light valves 240, 250, and 260 fixedly disposed onto the dichroic prism 210.

Hereinafter will be described operation of the projection-type display device 300.

White light (a white luminous flux) emitted from the light source 301 transmits through the integrator lenses 302 and 303. Light intensity (brightness distribution) of the white light is equalized by the integrator lenses 302 and 303. Preferably, the white light emitted from the light source 301 has a relatively high light intensity. This allows high-definition images to be formed on a screen 320. In addition, the projection-type display device 300 employs the liquid crystal panel 100 having an excellent light resistance. Accordingly, even when light emitted from the light source 301 has a high degree of light intensity, the display device 300 can have an excellent long-term stability.

Then, after transmitting through the integrator lenses 302 and 303, the white light is reflected by the mirror 304 to the left in FIG. 11. Then, among the reflected light, blue light (B) and green light (G) are reflected, respectively, by the dichroic mirror 305 to the bottom in FIG. 11, whereas red light (R) transmits through the dichroic mirror 305.

The red light, which has transmitted through the dichroic mirror 305, is reflected by the mirror 306 to the bottom in FIG. 11. The reflected red light is shaped by the converging lens 310 to be input to the for-red liquid crystal light valve 240.

Of the blue light and the green light reflected by the dichroic mirror 305, the green light is reflected by the dichroic mirror 307 to the left in FIG. 11, whereas the blue light transmits through the dichroic mirror 307.

The green light reflected by the dichroic mirror 307 is shaped by the converging lens 311 to be input to the for-green liquid crystal light valve 250.

In addition, the blue light that has transmitted through the dichroic mirror 307 is reflected by the dichroic mirror (or the mirror) 308 to the left in FIG. 11. The reflected blue light is next reflected by the mirror 309 to the top in FIG. 11. Consequently, the blue light is shaped by the converging lenses 312, 313, and 314 to be input to the for-blue liquid crystal light valve 260.

In this manner, the color-separating optical system color-separates the white light emitted from the light source 301 into respective light beams of three primary colors of red, green, and blue. Then, the corresponding liquid crystal light valves guide the respective color beams so as to input to the corresponding light valves.

On this occasion, each pixel (the switching element 1 and the pixel electrode 8 connected to the switching element 1) of the liquid crystal panel 100 included in the liquid crystal light valve 240 is switching-controlled (turned on/off), namely modulated by the driving circuit (a driving unit) operated based on a red image signal.

Similarly, the green light and the blue light, respectively, are input to the liquid crystal light valves 250, 260, respectively, and then modulated by the liquid crystal panel 100 of the respective valves, thereby forming a green image and a blue image. In this case, each pixel of the liquid crystal panel 100 included in the liquid crystal light valve 250 is switching-controlled by a driving circuit operated based on a green image signal. Additionally, each pixel of the liquid crystal panel 100 in the liquid crystal light valve 260 is switching-controlled by a driving circuit operated based on a blue image signal.

In this manner, the red light, the green light, and the blue light, respectively, are modulated by the liquid crystal light valves 240, 250, and 260, respectively, to form red, green, and blue images.

The red image formed by the liquid crystal light valve 240, namely, the red light from the liquid crystal light valve 240 is input to the dichroic prism 210 from the surface 213, reflected by the dichroic mirror surface 211 to the left in FIG. 11. Then, the red light is transmitted through the dichroic mirror surface 212, and then is emitted from an emitting surface 216.

Additionally, the green image formed by the liquid crystal light valve 250, namely, the green light from the liquid crystal light valve 250 is input to the dichroic prism 210 from the surface 214, transmitted through the dichroic mirror surfaces 211 and 212, and then is emitted from the emitting surface 216.

The blue image formed by the liquid crystal light valve 260, namely, the blue light from the liquid crystal light valve 260 is input to the dichroic prism 210 from the surface 215, reflected by the dichroic mirror surface 212 to the left in FIG. 11. The blue light is transmitted through the dichroic mirror surface 211, and then is emitted from the emitting surface 216.

Next, the dichroic prism 210 synthesizes the respective color light beams from the respective liquid crystal light valves 240, 250, and 260, namely, the respective color images formed by the above liquid crystal light valves, thereby forming a full-color image. The projection lens 220 projects (magnifies and projects) the full-color image on the screen 320 located in a predetermined position.

Therefore, the electronic apparatus including the liquid crystal panel 100 as described above is made highly reliable and achieves high-definition image display.

Other than the personal computer (the mobile personal computer) in FIG. 8, the mobile phone in FIG. 9, the digital still camera in FIG. 10, and the projection-type display device in FIG. 11, the electronic apparatus according to the embodiments of the invention may be applied to, for example, a television set, a video camera, a view-finder type or monitor direct-view-type video tape recorder, a car navigation device, a pager, an electronic organizer (with communications functions), an electronic dictionary, an electronic calculator, an electronic game device, a word processor, a work station, a video phone, a security television monitor, an electronic binocular, a POS terminal, a device equipped with a touch panel (e.g. a cash dispenser in banking facilities or an automatic ticket vending machine), a medical device (e.g. an electronic thermometer, an electronic manometer, a glucosemeter, an electrocardiographic apparatus, ultrasonic diagnostic equipment, or an endoscopic display), a fish detector, various kinds of measuring apparatuses, gauging instruments (e.g. instruments of cars, airplanes, or ships), a flight simulator, etc. Obviously, the electro-optical display device of the embodiment is applicable to displays and monitors of the various kinds of electronic apparatuses.

Accordingly, electronic devices and electronic apparatuses including the active-matrix device 10 are highly reliable.

Hereinabove, the active-matrix device, the electro-optical display device, and the electronic apparatus according to the embodiments have been described based on the embodiments shown in the drawings. However, embodiments of the invention are not restricted to those embodiments.

For example, the structures of respective sections included in the active-matrix device, the electro-optical display device, and the electronic apparatus of the embodiments can be replaced by arbitrary ones exhibiting similar functions. In addition, any arbitrary structures may be added.

Furthermore, in the foregoing embodiments, the projection-type display device (the electronic apparatus) has the three liquid crystal panels, and the electro-optical display device of the embodiment is applied to all of the panels. However, at least one of the three panels may have to be the electro-optical display device (the liquid crystal panel) of the embodiment. In this case, the embodiment is preferably applied to at least the liquid crystal panel used in the for-blue liquid crystal light valve.

Still furthermore, although the foregoing embodiment has described the example applying the embodiment to the transmissive electro-optical display device, embodiments of the invention are not restricted thereto and may be applied to reflective electro-optical display devices such as a liquid-crystal-on-silicon (LCOS) display device.

What is claimed is:

1. An active-matrix device, comprising:

a substrate;

a plurality of pixel electrodes provided on a first surface of the substrate;

a plurality of switching elements provided to correspond to each of the pixel electrodes, each of the switching elements including:

a fixed electrode connected to each of the pixel electrodes;

a movable electrode mainly made of silicon and displaceably provided so as to contact with and separate from the fixed electrode; and a driving electrode provided to oppose the movable electrode via an electrostatic gap;

a first wiring connected to the movable electrode; and a second wiring connected to the driving electrode, wherein a voltage is applied between the movable electrode and the driving electrode to generate an electrostatic attraction between the movable electrode and the driving electrode so as to displace the movable electrode such that the movable electrode contacts with the fixed electrode to electrically connect the first wiring to the pixel electrode;

the movable electrode includes a silicon layer made of monocrystalline silicon; and the silicon layer is formed by depositing an amorphous silicon film and then annealing the film.

2. An active-matrix device, comprising:

a substrate;

a plurality of pixel electrodes provided on a first surface of the substrate:

a plurality of switching elements provided to correspond to each of the pixel electrodes, each of the switching elements including:

a fixed electrode connected to each pixel electrode;

a movable electrode mainly made of silicon and displaceably provided so as to contact with and separate from the fixed electrode; and a driving electrode provided to oppose the movable electrode via an electrostatic gap;

a first wiring connected to the movable electrode; and a second wiring connected to the driving electrode, wherein a voltage is applied between the movable electrode and the driving electrode to generate an electrostatic attraction between the movable electrode and the driving electrode so as to displace the movable electrode such that the movable electrode contacts with the fixed electrode to electrically connect the first wiring to the pixel electrode, wherein the movable electrode is made of silicon carbide.

3. The active-matrix device according to claim 1, wherein the movable electrode is doped with an impurity that improves conductivity of the movable electrode.

4. The active-matrix device according to claim 1, wherein on the movable electrode is formed a thin film made of a material having a conductivity higher than that of silicon.

5. The active-matrix device according to claim 1, wherein the fixed electrode, the movable electrode, and the driving electrode are arranged such that the movable electrode contacts with the fixed electrode while remaining separated from the driving electrode.

6. The active-matrix device according to claim 5, wherein the movable electrode is cantilever-supported to displace a free end side of the movable electrode; the fixed electrode is located so as to oppose an end region on the free end side of the movable electrode; and the driving electrode is located relative to the fixed electrode so as to oppose a region on a fixed end side of the movable electrode.

7. The active-matrix device according to claim 1, wherein the pixel electrodes are located in positions different from the switching elements in a thickness direction of the substrate to allow each pixel electrode to be arranged so as to cover the switching element corresponding to the pixel electrode when two-dimensionally viewed.

8. The active-matrix device according to claim 1, wherein the first wiring includes a plurality of first wirings provided mutually in parallel along the substrate; the second wiring includes a plurality of second wirings intersecting with the first wirings and provided mutually in parallel along the substrate; and each switching element is provided near an intersection between each of the first wirings and each of the second wirings.

9. An electro-optical display device including the active-matrix device according to claim 1.

10. An electronic apparatus including the electro-optical display device according to claim 9.

11. The active-matrix device according to claim 2, wherein the movable electrode is doped with an impurity that improves conductivity of the movable electrode.

12. The active-matrix device according to claim 2, wherein on the movable electrode is formed a thin film made of a material having a conductivity higher than that of silicon.

13. The active-matrix device according to claim 2, wherein the fixed electrode, the movable electrode, and the driving electrode are arranged such that the movable electrode contacts with the fixed electrode while remaining separated from the driving electrode.

14. The active-matrix device according to claim 13, wherein the movable electrode is cantilever-supported to displace a free end side of the movable electrode; the fixed electrode is located so as to oppose an end region on the free end side of the movable electrode; and the driving electrode is located relative to the fixed electrode so as to oppose a region on a fixed end side of the movable electrode.

15. The active-matrix device according to claim 2, wherein the pixel electrodes are located in positions different from the switching elements in a thickness direction of the substrate to allow each pixel electrode to be arranged so as to cover the switching element corresponding to the pixel electrode when two-dimensionally viewed.

16. The active-matrix device according to claim 2, wherein the first wiring includes a plurality of first wirings provided mutually in parallel along the substrate; the second wiring includes a plurality of second wirings intersecting with the first wirings and provided mutually in parallel along the substrate; and each switching element is provided near an intersection between each of the first wirings and each of the second wirings.

17. An electro-optical display device including the active-matrix device according to claim 2.

18. An electronic apparatus including the electro-optical display device according to claim 17.

* * * * *